US010814589B1

(12) United States Patent
Scales et al.

(10) Patent No.: US 10,814,589 B1
(45) Date of Patent: Oct. 27, 2020

(54) ITEMS HAVING LEATHERBOARD LAYERS WITH MODIFIED PORTIONS

(71) Applicant: Apple Inc., Cupertino, CA (US)

(72) Inventors: Timothy W. Scales, San Francisco, CA (US); Whitney D. Mattson, Menlo Park, CA (US); Benjamin A. Stevenson, Oakland, CA (US); Linda D. Benavente-Notaro, Sherman Oaks, CA (US); Nicholas R. Trincia, San Francisco, CA (US); William H. Chui, Santa Clara, CA (US); Hao Zhu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/005,532

(22) Filed: Jun. 11, 2018

(51) Int. Cl.
| | |
|---|---|
| *H05K 1/02* | (2006.01) |
| *B32B 9/04* | (2006.01) |
| *F21V 15/01* | (2006.01) |
| *B32B 1/02* | (2006.01) |
| *B32B 9/02* | (2006.01) |
| *B32B 27/10* | (2006.01) |
| *B32B 27/20* | (2006.01) |
| *H05K 1/03* | (2006.01) |
| *H05K 1/18* | (2006.01) |
| *B32B 9/06* | (2006.01) |

(Continued)

(52) U.S. Cl.
CPC ............... *B32B 9/045* (2013.01); *B32B 1/02* (2013.01); *B32B 9/025* (2013.01); *B32B 9/06* (2013.01); *B32B 27/10* (2013.01); *B32B 27/20* (2013.01); *B32B 29/005* (2013.01); *F21V 15/01* (2013.01); *F21V 23/0442* (2013.01); *H05K 1/0366* (2013.01); *H05K 1/185* (2013.01); *B32B 2260/021* (2013.01); *B32B 2260/028* (2013.01); *B32B 2260/046* (2013.01); *B32B 2307/208* (2013.01); *B32B 2457/00* (2013.01); *F21Y 2115/10* (2016.08); *H05K 2201/083* (2013.01); *H05K 2201/10113* (2013.01); *H05K 2201/10121* (2013.01); *H05K 2201/10151* (2013.01)

(58) Field of Classification Search
CPC ........... B32B 9/045; B32B 1/02; B32B 9/025; B32B 9/06; B32B 27/10; B32B 27/20
USPC ....................................................... 361/748
See application file for complete search history.

(56) References Cited

U.S. PATENT DOCUMENTS

| | | |
|---|---|---|
| 1,131,039 A | 3/1915 | Clapp |
| 4,287,252 A | 9/1981 | Dimiter |

(Continued)

*Primary Examiner* — Tremesha S Willis
(74) *Attorney, Agent, or Firm* — Treyz Law Group, P.C.; G. Victor Treyz (57) ABSTRACT

An item may be formed from layers of material such as leatherboard layers. A leatherboard layer may include fibrous natural material such as leather or paper embedded in polymer. Portions of the leatherboard layer can be locally modified by incorporation of filler material with desired properties. The filler material may include magnetic particles, conductive particles, or other material. By incorporating the filler material in localized portions of the leatherboard layer, integral electrodes or magnets may be formed. The leatherboard layer may also include embedded circuitry. Items such as enclosures and other items may be formed from the leatherboard layer. The leatherboard layer in an item may include locally modified regions such as magnet regions that are configured to form a closure or other structures that interact with each other.

18 Claims, 9 Drawing Sheets

(51) Int. Cl.
*B32B 29/00* (2006.01)
*F21V 23/04* (2006.01)
*F21Y 115/10* (2016.01)

(56) References Cited

U.S. PATENT DOCUMENTS

| | | | |
|---|---|---|---|
| 4,453,996 A * | 6/1984 | Terlizzi, Jr. | A43B 5/12 |
| | | | 156/227 |
| 6,264,879 B1 | 7/2001 | Addie et al. | |
| 6,267,719 B1 | 7/2001 | Grisoni et al. | |
| 6,416,458 B1 | 7/2002 | Spiegler | |
| 6,855,883 B1 | 2/2005 | Matsui | |
| 2002/0133992 A1 * | 9/2002 | Wu | G09F 7/04 |
| | | | 40/661.01 |
| 2005/0276982 A1 * | 12/2005 | Manchee | B32B 9/02 |
| | | | 428/411.1 |
| 2006/0214922 A1 * | 9/2006 | Moore | B43L 1/00 |
| | | | 345/173 |
| 2009/0085251 A1 * | 4/2009 | Brown | B28B 11/0845 |
| | | | 264/294 |
| 2016/0165731 A1 * | 6/2016 | Hurwitz | H05K 1/183 |
| | | | 361/761 |
| 2018/0098600 A1 | 4/2018 | Bacino et al. | |
| 2018/0098602 A1 | 4/2018 | Kohatsu et al. | |

* cited by examiner

ITEMS HAVING LEATHERBOARD LAYERS WITH MODIFIED PORTIONS

FIELD

This relates generally to items such as enclosures, and, more particularly, to items formed from materials such as leatherboard.

BACKGROUND

Leather, paper, and other natural materials are widely used. During manufacturing, scraps of these natural materials are produced that represent a potential source of waste.

The formation of manufactured materials such as leatherboard from scraps of natural material helps to recycle natural products and reduce or eliminate waste. Items formed from leatherboard may have desired tactile properties and other satisfactory characteristics, but may be missing desired functionality.

SUMMARY

An item may be formed from leatherboard. Layers of leatherboard may be used to form an enclosure for an electronic device, part of an electronic device housing, or other items.

A leatherboard layer for an item may include fibrous natural material such as fibrous leather or paper in a polymer binder. Portions of the leatherboard layer can be locally modified by selective incorporation of filler material with desired properties. The filler material may include magnetic particles, conductive particles, or other material.

By incorporating filler material in localized portions of the leatherboard layer, integral electrodes, integral magnets, or other structures may be formed as part of the leatherboard layer without creating undesired discontinuities in the flexibility, density, or other mechanical properties of the leatherboard layer.

Magnets in leatherboard structures can interact to form a magnetic closure. If desired, the leatherboard layer may include regions with embedded circuitry. Sensors and other components in leatherboard layers or other portions of an item can be configured to interact with magnets, conductive regions, or other structures formed in a leatherboard layer.

DETAILED DESCRIPTION

Figure 1:
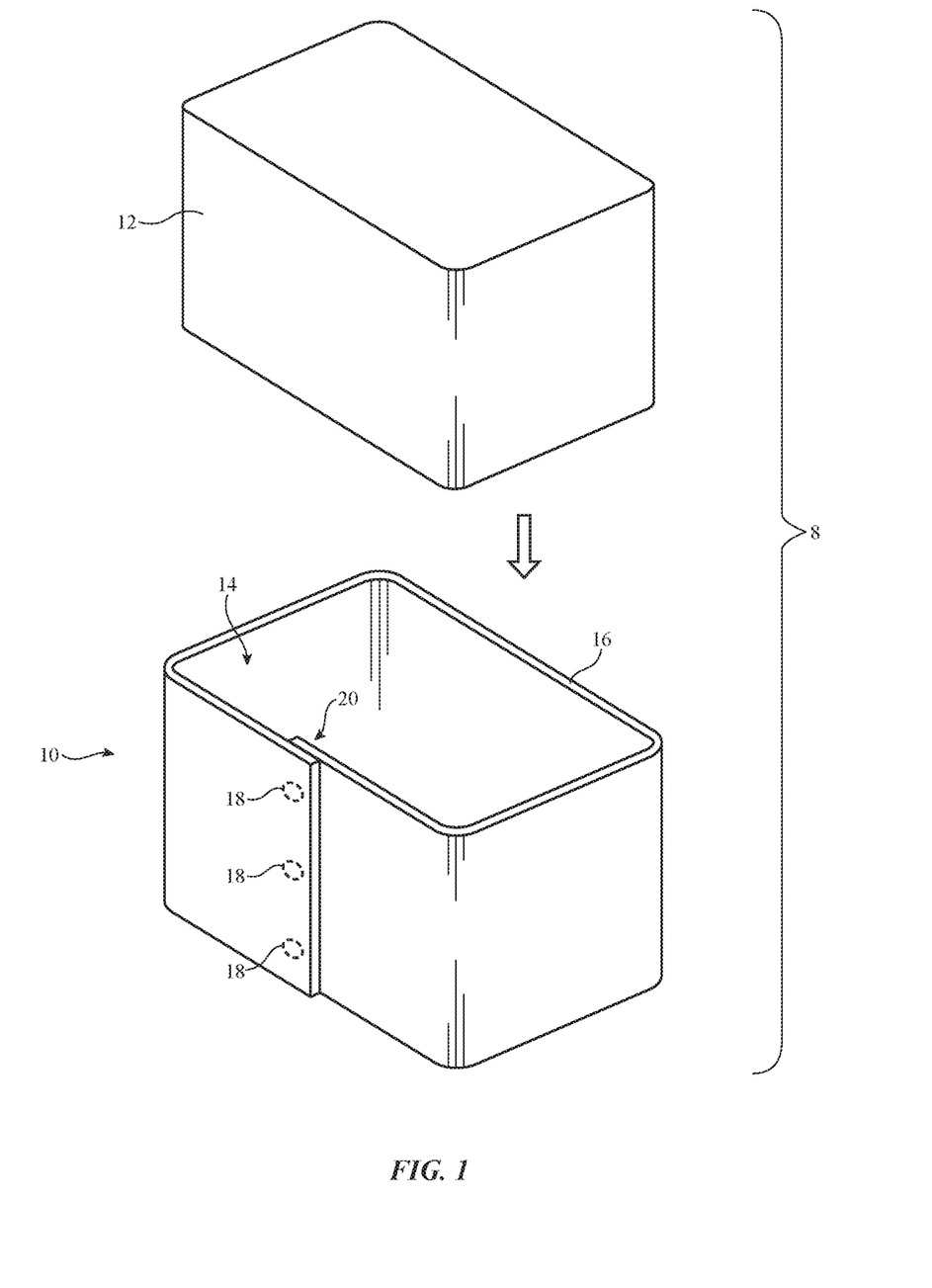
FIG. 1 is a perspective view of an illustrative system including a leatherboard item and an associated electronic device in accordance with an embodiment.

Layers of material such as leatherboard may be used in forming enclosures for electronic devices and other items. A perspective view of an illustrative system with a leatherboard item is shown in FIG. 1. In the example of FIG. 1, system 8 includes electronic device 12 and an associated leatherboard item 10.

Device 12 may be a cellular telephone, a computer such as a tablet computer, a laptop computer, or other computing device, a wristwatch device or other wearable device, a media player, a wearable augmented reality or virtual reality device (e.g., googles, glasses, a helmet, etc.), a set of headphones, a remote control, a pointing device such as a computer mouse, pencil, or trackpad, a keyboard, and/or other electronic equipment.

Item 10 may be an enclosure such as a removable cover for a device or a bag, may be an electronic device such as device 12, may be a wearable item (e.g., a wristwatch strap, arm band, head band, hat or other clothing, etc.), or other item. Item 10 may have portions formed from natural materials. For example, housing walls, straps, inner and/or outer layers, and other portions of item 10 may be formed from leatherboard.

Leatherboard is an artificial material formed from fibrous natural materials such as leather or paper in a polymer binder. Configurations in which leatherboard for item 10 includes fibrous leather (e.g., fibrous leather pieces from leather scraps) that is incorporated into polymer (e.g., a layer of polymer binder) may sometimes be described herein as an example.

As shown in FIG. 1, item 10 may be formed from one or more leatherboard layers such as layer 16. Layers such as layer 16 may, if desired, be used in forming walls (e.g., housing walls), straps, or other structures in item 10. In the illustrative configuration of FIG. 1, item 10 forms an enclosure (e.g., a removable cover or case) with an interior region 14 configured to receive electronic device 12. Other type of items may be formed from leatherboard layers such as layer 16, if desired.

Layer 16 may, if desired, include one or more locally modified portions such as portions 18. Portions 18 may include magnetic material or other material (e.g., conductive material, etc.). As an example, particles of magnetic material may be selectively incorporated into portions 18. In this way, portions 18 may include magnetized magnetic material forming a permanent magnet and/or magnetic material such as iron that exhibits magnetic attraction when exposed to magnetic field from a permanent magnet or electromagnet. The magnetic material of portions 18 may form a magnetic closure such as closure 20 (e.g., in configurations in which portions 18 are formed on overlapping portions of a single layer 16 or overlapping portions of a pair of separate layers 16). When it is desired to close the closure, portions 18 on overlapping sections of layer 16 may be placed in close proximity so that these potions attract each other. When it is desired to open the closure, the overlapping sections of layer 16 may be pulled apart, thereby overcoming the magnetic attraction between mated magnetic portions 18. If desired, portions 18 may include magnetic material that interacts with magnetic sensor circuitry. Arrangements in which portions 18 are locally modified by incorporation of conductive particles (e.g., to form shielding, signal paths, etc.) may also be used.

Figure 2:
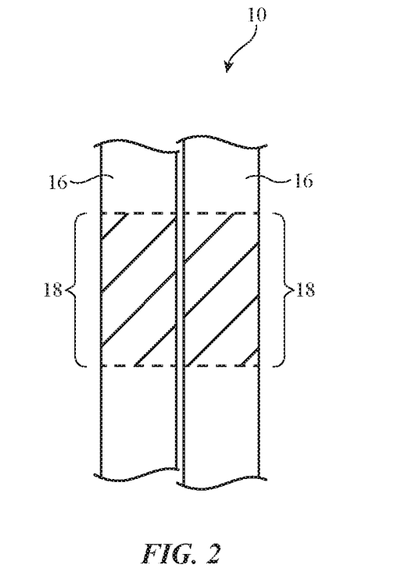
FIG. 2 is a cross-sectional side view of illustrative leatherboard layers with locally modified portions in accordance with an embodiment.

FIG. 2 is a cross-sectional side view of illustrative overlapping leatherboard layers 16 in which portions 18 are aligned. Portions 18 may be modified by incorporating magnetic material into portions 18 and by magnetizing one or both of portions 18 to form permanent magnet structures. The remaining portion of layer 16 in this type of configuration will not contain magnetized magnetic material (e.g., the remaining portion of layer 16 will not include the magnetic material incorporated into portions 18).

During operation, portions 18 that have been formed from magnetic material may serve as magnetic structures that temporarily hold layers 16 to each other (e.g., portions 18 may form a closure or clasp that holds layers 16 together when portions 18 on each of layers 16 have been aligned). Portions 18 may also serve as magnetic attachment points for external equipment with magnets, may be formed on the ends of layer 16 so that portions 18 can be inserted into a mating magnetic slot (e.g., a slot in layer 16 or other slotted structures), may be patterned to encode information (e.g., to form a magnetic code serving as an identifier, serial number, product type information, and/or other coded information that can be detected using a magnetic sensor) and/or may otherwise be used in forming magnetic structures. Magnetic material in portions 18 may be used to form isotropic magnets or anisotropic magnets.

Figure 3:
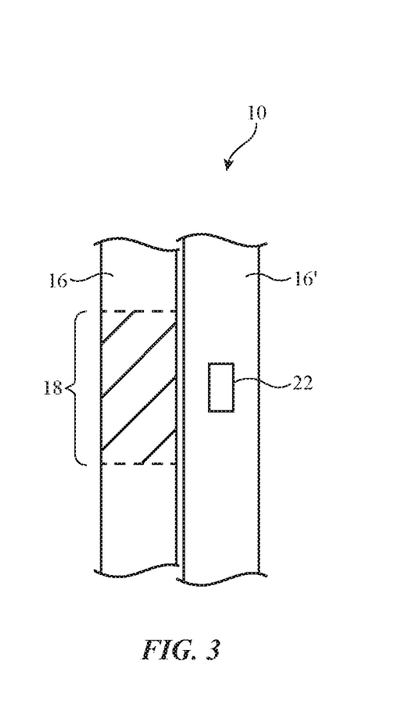
FIG. 3 is a cross-sectional side view of an illustrative leatherboard layer with a locally modified portion and an associated layer with a component that interacts with the locally modified portion in accordance with an embodiment.

As shown in FIG. 3, item 10 may include a leatherboard layer such as layer 16 that includes a locally modified portion 18 and an additional layer such as layer 16' (e.g., a leatherboard layer, a layer formed from polymer and/or other materials, other structures, etc.). Component 22 may be coupled to layer 16' and may interact with locally modified portion 18. For example, component 22 may be a magnetic sensor and portion 18 may be formed from a magnetic material that can be sensed by the magnetic sensor when portion 18 is adjacent to sensor 22. As another example, component 22 may be a capacitive sensor and portion 18 may be formed from a conductive material that can be sensed by the capacitive sensor. If desired, component 22 may be an electromagnet that magnetically interacts with magnetic material in portion 18 when components 22 and portion 18 are aligned.

Layer 16 and layer 16' may both form part of item 10 or layer 16 and layer 16' may be formed in separate items. For example, layer 16 may form part of item 10 (e.g., a cover for a tablet computer or cellular telephone) and layer (structure) 16' may form part of device 12 (e.g., a tablet computer or cellular telephone with a magnetic sensor such as a Hall effect sensor that senses the presence or absence of portion 18 of layer 16 to determine whether the cover is present and/or in a closed state).

Figure 4:
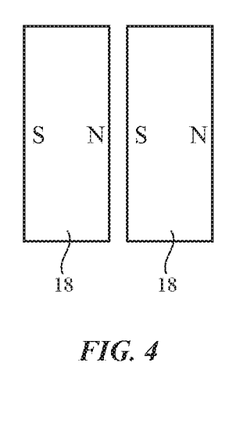
FIG. 4 is a cross-sectional side view of a pair of interacting magnets for a closure or other structure in an item in accordance with an embodiment.
Figure 5:
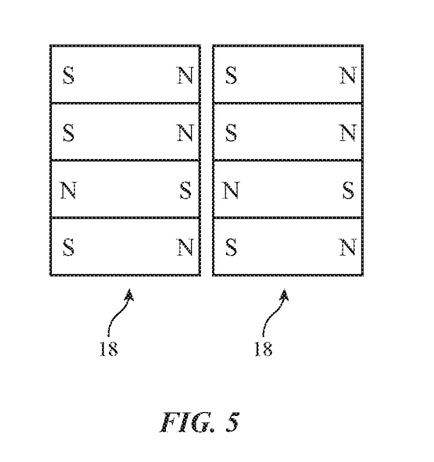
FIG. 5 is a cross-sectional side view of illustrative interacting magnets with multiple magnetic domains in accordance with an embodiment.

An illustrative arrangement in which locally modified portions 18 are configured to form a pair of mating permanent magnets is shown in FIG. 4. In the FIG. 4 example, each magnet has a single magnetic domain. FIG. 5 shows how locally modified portions 18 may, if desired, include pattern of multiple magnetic domains (e.g., each magnet may be a multipole magnet having a pattern of magnetic domains that matches a corresponding complementary pattern of magnetic domains in the other magnet). Arrangements in which locally modified portions 18 include different magnetic structures (e.g., different types of permanent magnets, pads of magnetic material that are not permanently magnetized, etc.) can also be used.

Figure 6:
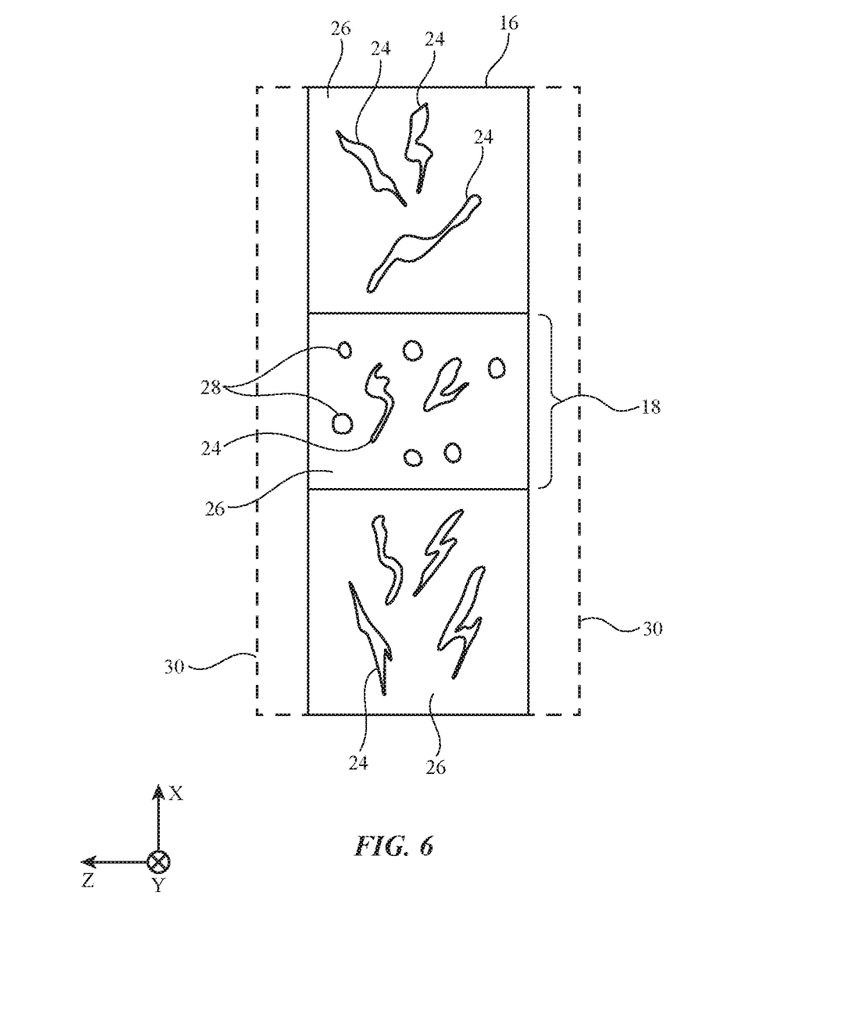
FIG. 6 is a cross-sectional side view of an illustrative leatherboard layer with a locally modified portion in accordance with an embodiment.

FIG. 6 is a cross-sectional side view of leatherboard layer 16 in an illustrative arrangement in which layer 16 includes a locally modified region (region 18). In portions of layer 16 other than locally modified portion 18, layer 16 includes fibrous material 24 embedded in polymer 26. Fibrous material 24 may be fibrous natural material such as fibrous leather, fibrous paper, etc. Polymer 26 may be a flexible polymer such as polyvinyl alcohol (PVA), polyurethane, silicone, a fluoroelastomer (e.g., an FKM), butyl rubber, or other elastomeric polymer. In locally modified portions 18 of layer 16, filler 28 is embedded in polymer 26. Fibrous material 24 may also be included in portions 18 to help maintain a desired leather-like feel of layer 16 in portions 18 or may be omitted from portions 18. Portions 18 may include the same type of polymer 26 that is formed in other portions of layer 16 or may include a different type of polymer 26 than in other portions of layer 16.

The materials of portions 18 and surrounding portions of layer 16 may be configured help match the feel of portions 18 to the feel of surrounding portions of layer 16 (e.g., so that all of layer 16 has a uniform leather-like quality of uniform flexibility and density, and/or to otherwise mechanically and/or cosmetically match these areas of layer 16 to create a seamless transition between portions 18 and the rest of layer 16). As a result, undesirable rigid lumps and other undesirable features may be avoided when incorporating magnets (or other structures) into layer 16. For example, the flexibility and/or density of portions 18 will vary by less than 30%, less than 10%, less than 5%, more than 0.1%, or other suitable amount relative to the remainder of layer 16.

If desired, optional additional materials may be coupled to layer 16. For example, outer layers such as layers 30 may be formed on one or more sides of layer 16. Layers 30 may each include one or more layers fabric, leather, polymer, or other materials coupled to a corresponding exterior surface of layer 16 (e.g., using adhesive). By avoiding undesirable rigid lumps within layer 16, a user will not notice any discontinuity in the flexibility (stiffness) and other properties of layer 16, even when layer 16 is covered with one or more layers 30.

Filler 28 may be provided in the forms of particles, strands of material, flakes, and/or other structures. In some arrangements, filler 28 may be dispensed in a liquid slurry. The material of filler 28 may be magnetic, may be electrically conductive, may be thermally conductive, may impart desired optical properties (e.g., color, light transmission, absorption, reflection, haze, etc.), may affect the flexibility or other mechanical properties of portion 18, and/or may otherwise have properties that alter the characteristics of portions 18 relative to the other portions of layer 16. Examples of magnetic material that may be used in forming filler 28 include iron, neodymium magnet material (NdFeB) or other rare-earth magnet material, alnico, ferrite, etc. Materials such as these may, for example, be incorporated into polymer 26 in the form of particles (e.g., in a liquid slurry of magnetic powder). Examples of electrically conductive material that may be used in forming filler 28 include carbon black, copper, iron, and other metals, etc. If desired, filler 28 may exhibit both magnetic properties and electrically conductive properties. Filler 28 (e.g., metal filler or other thermally conductive material, fiberglass strands, etc.) may also be used to adjust the thermal and/or mechanical properties of layer 16.

Portions 18 may penetrate entirely through the thickness of layer 16 (in dimension Z of FIG. 6) and/or may penetrate partway through layer 16. In some configurations, portions 18 may be formed in the interior of layer 16, so that portions 18 are sandwiched between opposing outer portions of layer 16 that do not include filler 28. The thickness (in dimension Z) of layer 16 and portion 18 may be, for example, at least 0.1 mm, at least 0.3 mm, at least 0.8 mm, at least 1.5 mm, at least 3 mm, less than 4 mm, less than 2 mm, less than 1 mm, or other suitable thickness. Each portion 18 may have lateral dimensions (e.g., in the X-Y plane of FIG. 6) of at least 0.1 mm, at least 0.5 mm, at least 1 mm, at least 4 mm, at least 1.5 cm, at least 6 cm, less than 100 cm, less than 20 cm, less than 2 cm, or other suitable size. The shape of portion 18 (e.g., the outline of portion 18 in the X-Y plane) may be rectangular, square, oval, circular, may have straight edges, curved edges, straight and curved edges, may be elongated (e.g., to form a line), may have a serpentine shape, and/or may have other suitable shape.

Figure 7:
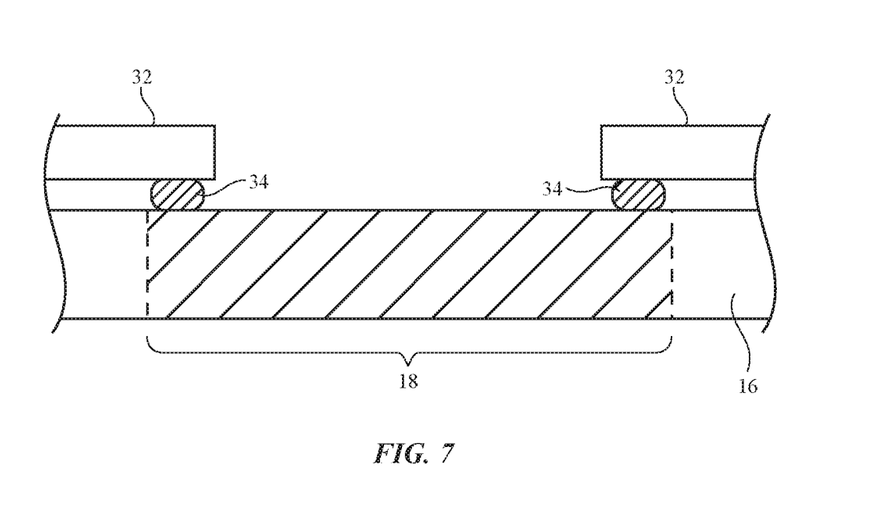
FIG. 7 is a cross-sectional side view of an illustrative leatherboard layer with a locally modified portion serving as a signal path in accordance with an embodiment.

FIG. 7 is a cross-sectional side view of layer 16 in an illustrative configuration in which locally modified portion 18 of layer 16 includes conductive filler so that portion 18 serves as an electrical path. As shown in FIG. 7, electrical components 32 may be coupled by conductive material 34 (e.g., solder, conductive adhesive, welds, conductive fasteners, etc.) to a signal path formed from portion 18. The signal path may be part of a bus of multiple parallel lines, may form an isolated electrical line, may have a meandering path shape, may have portions forming contact pads (e.g., solder pads), and/or may have other suitable shapes.

Figure 8:
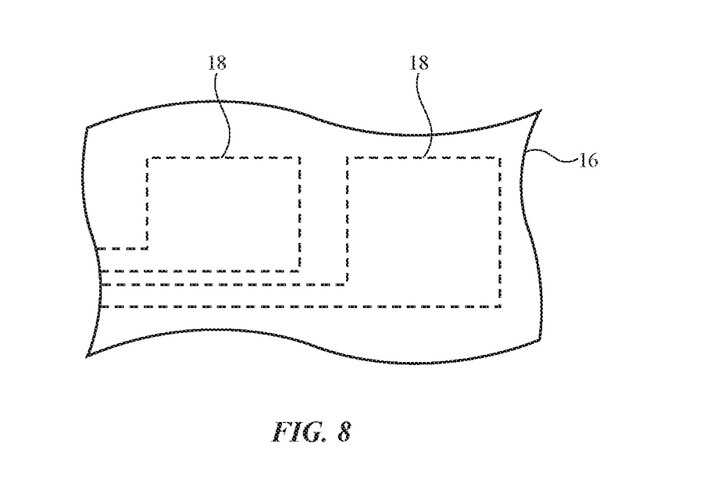
FIG. 8 is a top view of an illustrative leatherboard layer with locally modified portions forming electrodes such as capacitive sensor electrodes in accordance with an embodiment.

FIG. 8 is a top view of layer 16 in an illustrative configuration in which portions 18 include conductive filler and are patterned to form an array of electrodes. The electrodes in layer 16 that are formed from portions 18 may be used to form capacitive sensor electrodes (e.g., for a capacitive touch sensor, a capacitive proximity sensor that detects fingers and other external objects at a distance from layer 16, a capacitive touch sensitive switch, or other capacitive sensor structures). The electrodes in FIG. 8 may be electrically coupled to capacitive sensing circuitry through signal paths formed from portions 18 and/or other conductive paths. If desired, a pattern of electrodes (e.g., rectangular pads, elongated strip-shaped electrodes, etc.) can be formed in layer 16 that are detected by capacitive sensor circuitry (see, e.g., component 22 of FIG. 3). The capacitive sensor circuitry may form part of device 12 (e.g., a capacitive touch sensor array in device 12). The arrangement of FIG. 8 in which portions 18 form signal paths that electrically couple capacitive sensor pads to capacitive sensor circuitry (e.g., a touch sensor integrated circuit) is illustrative.

Figure 9:
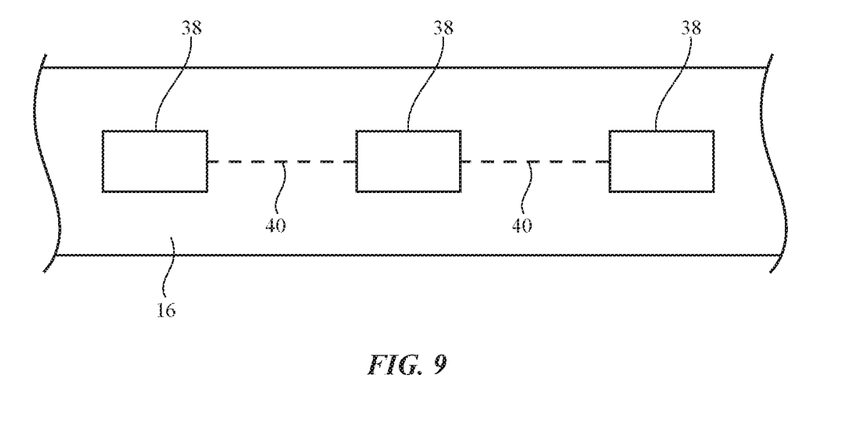
FIG. 9 is a cross-sectional side view of an illustrative leatherboard layer having embedded circuitry in accordance with an embodiment.

FIG. 9 is a cross-sectional side view of layer 16 in an illustrative configuration in which components 38 and signal paths 40 have been embedded in layer 16. Signal paths may be formed from portions 18 and/or from embedded wires or other conductive strands of material, metal traces on printed circuits such as metal traces on flexible printed circuits, or other conductive structures. Components 38 may be electrical components such as integrated circuits, energy storage devices such as capacitors and batteries, input-output devices (e.g., input devices such as sensors, output devices such as displays, light-emitting diodes, and other light-emitting devices, etc.), wireless power circuitry, etc.

The circuitry of components 38 and paths 40 may be used in forming control circuitry for item 10 and may be used in forming input-output circuitry. The control circuitry may include storage and processing circuitry for supporting the operation of item 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in the control circuitry may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between item 10 and external equipment, the control circuitry may communicate using communications circuitry. The communications circuitry may include antennas, radio-frequency transceiver circuitry, and other wireless communications circuitry and/or wired communications circuitry. The communications circuitry, which may sometimes be referred to as control circuitry and/or control and communications circuitry, may support bidirectional wireless communications between item 10 and external equipment (e.g., device 12) over a wireless link (e.g., control and communications circuitry in item 10 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a 60 GHz link or other millimeter wave link, a cellular telephone link, or other wireless communications link.

The circuitry of components 38 and paths 40 may, if desired, include power circuits for transmitting and/or receiving wired and/or wireless power and may include batteries or other energy storage devices. For example, item 10 may include a coil and rectifier to receive wireless power.

The circuitry of components 38 and paths 40 may also include input-output devices that are used in gathering user input, in gathering information on the environment surrounding the user, and/or in providing a user with output. The input-output devices may include one or more displays or components forming pixels for displays (e.g., an organic light-emitting diode display, a liquid crystal display, an electrophoretic display, an electrowetting display, a plasma display, a microelectromechanical systems display, a display having a pixel array formed from crystalline semiconductor light-emitting diode dies, and/or other displays). The displays may be touch insensitive or may include touch sensor circuitry. The input-output devices may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor overlapping a display, and/or a touch sensor that forms a button, trackpad, or other input device not associated with a display), and other sensors. If desired, the sensors may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, item 10 may use the sensors and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.). If desired, the input-output devices may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. The input-output devices of item 10 may also include connector ports for supporting wired communication with ancillary equipment and for receiving wired power. Although shown in FIG. 9 as being surrounded on all sides by portions of leatherboard layer 16, the structures of components 38 and paths 40 may, if desired, protrude out of one or both sides of layer 16, if desired.

Figure 10:
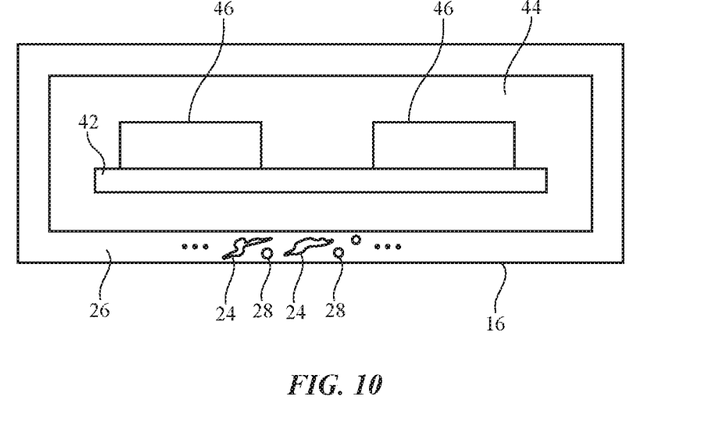
FIG. 10 is a cross-sectional side view of an illustrative leatherboard layer having conductive material that forms electromagnetic shielding in accordance with an embodiment.

FIG. 10 is a cross-sectional side view of layer 16 in an illustrative configuration in which layer 16 includes structures that surround components 40. Components 40 (e.g., components such as components 38 of FIG. 9 and/or other circuitry) may be mounted on one or more substrates such as printed circuit 42 and/or may be connected by other signal paths (see, e.g., paths 40 of FIG. 9). To electromagnetically shield the circuitry of components 40, leatherboard layer 16 may incorporate conductive filler 28 in addition to fibrous material 24 in binder such as polymer 26. Shielding may be formed on one or both sides of components 40. For example, layer 16 may be a single planar layer on one side of components 40 that forms a signal ground plane in item 10 and/or may form a three-dimensional enclosure that encloses components 40. Shielding may be included in a portion of layer 16 adjacent to components 46 (as an example).

Figure 11:
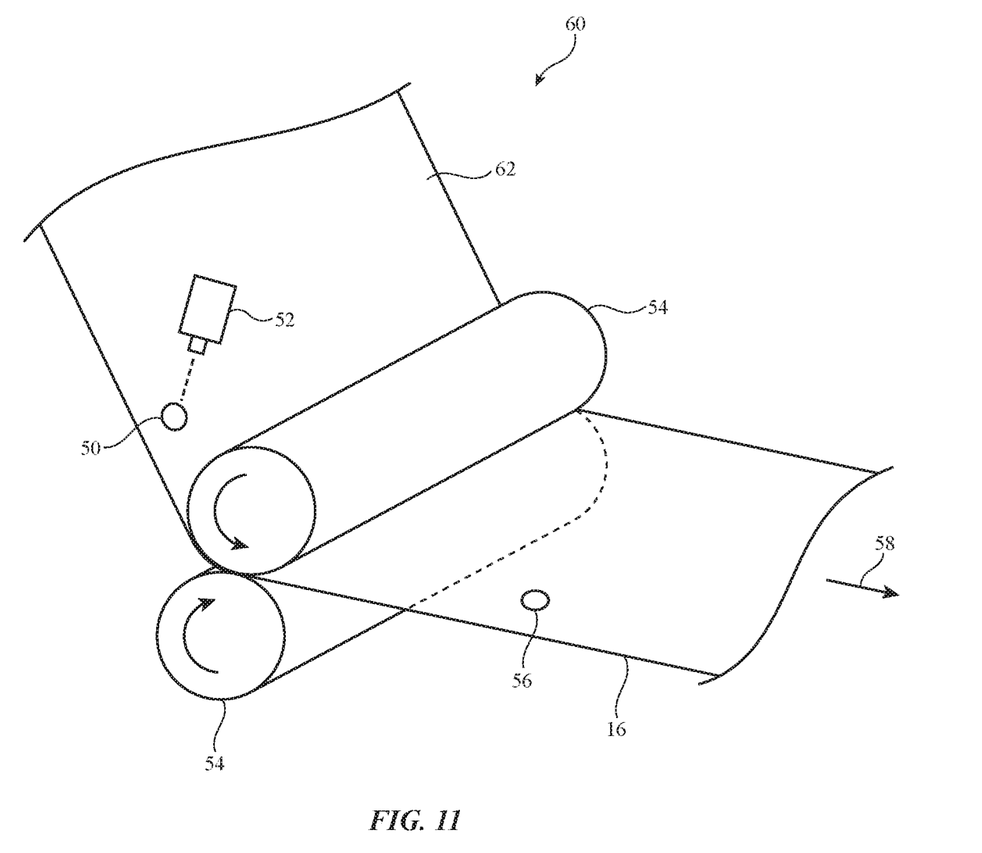
FIG. 11 is a perspective view of illustrative equipment for forming leatherboard in accordance with an embodiment.

Illustrative equipment for forming leatherboard layer 16 is shown in FIG. 11. In general, leatherboard layer 16 may be formed in any suitable type of tool that incorporates fibrous material 24 and other desired materials into binder such as polymer 26 (e.g., extrusion equipment, equipment with plates that press together, molds with three-dimensional shapes, etc.). In the illustrative arrangement of FIG. 11, leatherboard fabrication equipment 60 includes rollers 54. Preformed leatherboard layer 62 may be calendared (e.g., to establish a desired thickness, to emboss a desired texture, etc.) by passing this layer through rollers 54 in direction 58.

Dispenser 52 may dispense liquid magnetic particle slurry, conductive particle slurry, other filler material for filler 28, electrical components (e.g., components 38 of FIG. 9), structures for forming paths 40, and/or other material, components, and/or circuitry into location 50 of layer 62. After layer 62 passes through rollers 54 in direction 58 to form leatherboard layer 16, the circuitry and/or material incorporated into location 50 will be located at a location such as location 56 and may form a locally modified portion of leatherboard layer 16 (e.g., one of portions 18) and/or embedded circuitry (see, e.g., embedded components 38 and/or paths 40 of FIG. 9). Leatherboard layer 16 may then be cut to a desired shape and assembled with additional structures and circuitry to form item 10.

The foregoing is illustrative and various modifications can be made to the described embodiments. The foregoing embodiments may be implemented individually or in any combination.

What is claimed is:

1. A leatherboard layer having a first portion and a second portion, wherein the leatherboard layer comprises:
   a layer of polymer in the first and second portions;
   fibrous natural material embedded in the layer of polymer in the first and second portions; and
   filler material that is in the first portion and that is not in the second portion.

2. The leatherboard layer defined in claim 1, wherein:
   the fibrous natural material comprises fibrous leather;
   the leatherboard layer is configured to form an enclosure for an electronic device;
   the filler material comprises particles of magnetic material; and
   the first portion is magnetized to form a magnet.

3. The leatherboard layer defined in claim 1 wherein the filler material comprises magnetic material.

4. The leatherboard layer defined in claim 1 wherein the filler material comprises conductive material.

5. The leatherboard layer defined in claim 1 wherein the fibrous natural material comprises leather.

6. The leatherboard layer defined in claim 1 wherein the fibrous natural material comprises paper.

7. The leatherboard layer defined in claim 1 further comprising circuitry embedded in the leatherboard layer.

8. The leatherboard layer defined in claim 7 wherein the circuitry comprises an input device.

9. The leatherboard layer defined in claim 8 wherein the input device comprises a sensor.

10. The leatherboard layer defined in claim 7 wherein the circuitry comprises an output device.

11. The leatherboard layer defined in claim 10 wherein the output device comprises a light source.

12. An item, comprising:
   a leatherboard structure having first and second portions comprising fibrous leather in polymer and having a first locally modified region in the first portion, wherein the first locally modified region comprises magnetized magnetic material that is in the first portion and that is not in the second portion; and
   a second leatherboard structure comprising fibrous leather in polymer and having a second locally modified region, wherein the first and second leatherboard structures are configured to overlap to align the first locally modified region with the second locally modified region.

13. The item defined in claim 12 wherein the magnetized magnetic material of the first locally modified region serves as a first magnet, wherein the second locally modified region comprises magnetic material that serves as a second magnet, and wherein the first and second magnets are configured to form a magnetic closure.

14. The item defined in claim 13 wherein the first and second locally modified regions include the fibrous leather in the polymer and include the magnetized magnetic material embedded in the polymer.

15. The item defined in claim 14 wherein the first and second leatherboard structures form respective portions of a common leatherboard layer.

16. An item, comprising:
   a layer having fibrous natural material in polymer binder, wherein the layer has a first portion that includes filler material and a second portion that does not include the filler material and wherein the fibrous material is selected from the group consisting of: leather and paper; and
   a sensor configured to detect the first portion when the first portion is aligned with the sensor.

17. The item defined in claim 16 wherein the sensor comprises a magnetic sensor and wherein the filler material comprises magnetic material configured to form a magnet in the first portion.

18. The item defined in claim 16 wherein the layer comprises a leatherboard layer, the item further comprising a layer of fabric that is attached to the leatherboard layer and that covers the first portion.

* * * * *